United States Patent
Scott et al.

(10) Patent No.: US 10,116,298 B2
(45) Date of Patent: Oct. 30, 2018

(54) APPARATUS WITH MAIN TRANSISTOR-BASED SWITCH AND ON-STATE LINEARIZATION NETWORK

(71) Applicant: Qorvo US, Inc., Greensboro, NC (US)

(72) Inventors: Baker Scott, San Jose, CA (US); George Maxim, Saratoga, CA (US); Marcus Granger-Jones, Scotts Valley, CA (US); Dirk Robert Walter Leipold, San Jose, CA (US); Jinsung Choi, Greensboro, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/393,699

(22) Filed: Dec. 29, 2016

(65) Prior Publication Data

US 2017/0288659 A1   Oct. 5, 2017

Related U.S. Application Data

(60) Provisional application No. 62/315,769, filed on Mar. 31, 2016.

(51) Int. Cl.
| | |
|---|---|
| H04B 1/44 | (2006.01) |
| H03K 17/687 | (2006.01) |
| H03K 17/16 | (2006.01) |
| H03K 17/14 | (2006.01) |

(52) U.S. Cl.
CPC ......... H03K 17/161 (2013.01); H03K 17/145 (2013.01)

(58) Field of Classification Search
CPC .................. H03K 17/161; H03K 17/145
See application file for complete search history.

(56) References Cited

U.S. PATENT DOCUMENTS

| | | | | |
|---|---|---|---|---|
| 6,642,578 B1 * | 11/2003 | Arnold | ...................... | H01P 1/15 |
| | | | | 257/341 |
| 7,459,988 B1 * | 12/2008 | Iversen | ..................... | H01P 1/15 |
| | | | | 327/430 |
| 7,492,209 B2 * | 2/2009 | Prikhodko | ................ | H01P 1/15 |
| | | | | 327/384 |
| 8,461,903 B1 * | 6/2013 | Granger-Jones | ....... | H03K 17/04 |
| | | | | 327/427 |
| 8,786,002 B2 * | 7/2014 | Kondo | ..................... | H04B 1/48 |
| | | | | 257/296 |
| 9,236,957 B2 | 1/2016 | Bolton et al. | | |
| 9,240,770 B2 * | 1/2016 | Kerr | ..................... | H03K 17/693 |

* cited by examiner

*Primary Examiner* — Kenneth B Wells
(74) *Attorney, Agent, or Firm* — Withrow & Terranova, P.L.L.C.

(57) ABSTRACT

An apparatus including a main transistor-based switch having a first end node and a second end node and an ON-state linearization network that is coupled between the first end node and the second end node of the main transistor-based switch is disclosed. The ON-state linearization network is configured to receive a monitored signal that corresponds to a signal across the first end node and the second end node and cancel at least a portion of non-linear distortion generated by the main transistor-based switch when the main transistor-based switch is in an ON-state based on the monitored signal. A control signal applied to a control input of the ON-state linearization network causes the ON-state linearization network to activate when the main transistor-based switch is in the ON-state and to deactivate the ON-state linearization network when the main transistor-based switch is an OFF-state.

24 Claims, 7 Drawing Sheets

APPARATUS WITH MAIN TRANSISTOR-BASED SWITCH AND ON-STATE LINEARIZATION NETWORK

RELATED APPLICATIONS

This application claims the benefit of provisional patent application Ser. No. 62/315,769, filed Mar. 31, 2016, the disclosure of which is hereby incorporated herein by reference in its entirety.

FIELD OF THE DISCLOSURE

The present disclosure relates to an apparatus that includes a main transistor-based switch that includes an ON-state linearization network that is coupled across the main transistor-based switch and is configured to cancel at least a portion of non-linear distortion generated by the main transistor-based switch when the main transistor-based switch is in an ON-state.

BACKGROUND

A wireless transceiver operating in an up-link carrier aggregation (UL-CA) mode with two high power transmit signals simultaneously passing through a main transistor-based switch presents a challenging linearity constraint for the main transistor-based switch in an ON-state. A native linearity of a main transistor-based switch passing two high power transmit signals simultaneously does not on its own meet linearity requirements of UL-CA standards. As such, there is a need for an apparatus that includes the main transistor-based switch and a linearization network for the main transistor-based switch that cancels enough non-linear distortion generated by the main transistor-based switch to meet linearity requirements of UL-CA standards.

SUMMARY

An apparatus including a main transistor-based switch having a first end node and a second end node and an ON-state linearization network that is coupled between the first end node and the second end node of the main transistor-based switch is disclosed. The ON-state linearization network is configured to receive a monitored signal that corresponds to a signal across the first end node and the second end node and cancel at least a portion of non-linear distortion generated by the main transistor-based switch when the main transistor-based switch is in an ON-state based on the monitored signal. A control signal applied to a control input of the ON-state linearization network causes the ON-state linearization network to activate when the main transistor-based switch is in the ON-state and to deactivate the ON-state linearization network when the main transistor-based switch is an OFF-state.

In an exemplary embodiment, the apparatus further includes a control system configured to provide the control signal through an output coupled to the control input. In the exemplary embodiment, the main transistor-based switch is made up of an N number of main field effect transistors (FETs), wherein N is a finite number greater than one, and each main FET has a first terminal, a second terminal, and a gate terminal. The N number of main FETs are stacked in series such that the first terminal of a first main FET of the N number of main FETs is coupled to the first end node, and the second terminal of an Nth main FET of the N number of main FETs is coupled to the second end node. In another exemplary embodiment, an OFF-state linearization network is coupled between the gate terminal of the first main FET and the gate terminal of the Nth main FET.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
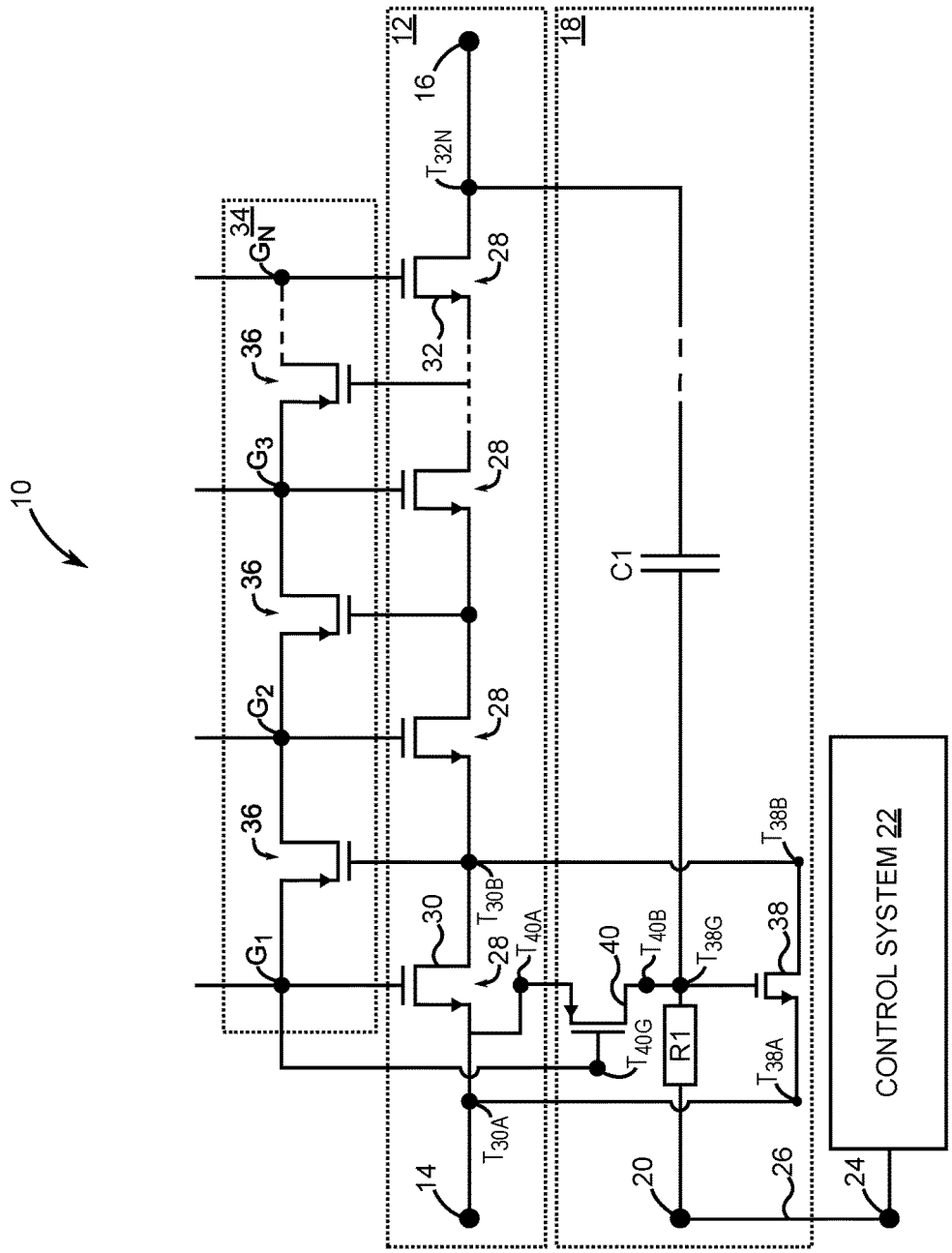
FIG. 1 is a schematic of an apparatus that provides both ON-state and OFF-state switch linearization in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein. For example, an ON-state for a switch or transistor is defined as a switching state in which the switch or transistor allows a signal current to flow through the switch or transistor. An OFF-state for a switch or transistor is defined as a switching state in which the switch or transistor blocks a signal current from flowing through the switch or transistor.

Generally, the present disclosure provides solutions for problems created by non-linearity of a main transistor-based switch when the main transistor-based switch is operated in an ON-state. The solutions provided are applicable for up-link carrier aggregation (UL-CA) modes in which two large transmit signals are interacting such that third order distortion is generated. High linearity switches include a bias input and a bias line for gate control. High linearity switches also often an OFF-state linearization network that needs a separate control input and control line for switch bias. An ON-state linearization network provided in this disclosure also requires a control input and control line.

Each additional control input and control line will reduce a quality factor (Q) of the main transistor-based switch. Embodiments of the present disclosure share a single control input and control line that activate the ON-state linearization network and deactivates the OFF-state linearization network when the main transistor-based switch is in the ON-state. In contrast, these embodiments also share the single control input and control line to activate the OFF-state linearization network and deactivate the ON-state linearization network when the main transistor-based switch is in the OFF-state.

FIG. 1 is a schematic of an apparatus 10 that provides both ON-state and OFF-state switch linearization in accordance with the present disclosure. The apparatus 10 includes a main transistor-based switch 12 having a first end node 14 and a second end node 16. The apparatus 10 further includes an ON-state linearization network 18 that is coupled between the first end node 14 and the second end node 16. The ON-state linearization network 18 is configured to receive a monitored signal that corresponds to a signal across the first end node 14 and the second end node 16. The signal is a radio frequency (RF) signal that is generated by an RF voltage drop across a total resistance for the main transistor-based switch 12 when the main transistor-based switch 12 is in the ON-state.

The ON-state linearization network 18 is also configured to, based on the monitored signal, cancel at least a portion of non-linear distortion generated by the main transistor-based switch 12 when the main transistor-based switch 12 is in the ON-state. A control signal applied to a control input 20 of the ON-state linearization network 18 causes the ON-state linearization network 18 to activate when the main transistor-based switch 12 is in the ON-state and to deactivate the ON-state linearization network 18 when the main transistor-based switch 12 is in the OFF-state.

A control system 22 has a control output 24 coupled to the control input 20 by a single line 26. The control system 22 is configured to provide the control signal to the ON-state linearization network 18.

The main transistor-based switch 12 comprises an N number of main field effect transistors (FETs) 28, wherein N is a finite number greater than one, and each main FET 28 has a first terminal, a second terminal, and a gate terminal. For example, if N equals 10 there will be 10 main FETs 28 that are coupled in series to make up the main transistor-based switch 12. The N number of main field effect transistors (FETs) 28 are stacked in series such that a first terminal $T_{30A}$ of a first main FET 30 of the N number of main FETs 28 is coupled to the first end node 14, and an Nth terminal $T_{32N}$ of an Nth main FET 32 of the N number of main FETs 28 is coupled to the second end node 16. In the exemplary embodiment of FIG. 1, each FET of the N number of main FETs 28 is a negative channel FET (NFET).

The apparatus 10 further includes an OFF-state linearization network 34 that is coupled between a gate terminal G1 of the first main FET 30 and a gate terminal GN of the Nth main FET 32. In the exemplary embodiment of FIG. 1, the OFF-state linearization network 34 is made up of a K number of OFF-state noise cancelling (OSNC) FETs 36 each having an input terminal, an output terminal, and a sense terminal. The number K is a finite number that is at least equal to one. Individual ones of the OSNC FETs 36 have an input terminal coupled to the gate terminal of a nearest following one of the N number of main FETs 28, and individual ones of the OSNC FETs 36 have an output terminal coupled to the gate terminal of the nearest following one of the N number of main FETs 28. Individual ones of the OSNC FETs 36 have a sense terminal coupled to both the first terminal of the nearest following one of the N number of main FETs 28 and the second terminal of the nearest preceding one of N number of main FETs 28.

The ON-state linearization network 18 further includes a non-linear distortion cancellation (NDC) FET 38 having a first NDC terminal $T_{38A}$ coupled to the first terminal $T_{30A}$ of the first main FET 30 and a second NDC terminal $T_{38B}$ coupled to a second terminal $T_{30B}$ of the first main FET 30, and an NDC gate terminal communicatively coupled to both the control input 20 and the Nth terminal $T_{32N}$ of the Nth main FET 32. A resistor R1 is coupled between the control input 20 and the NDC gate terminal of the NDC FET 38. The resistor R1 provides buffering between the control input 20 and the NDC gate terminal $T_{38G}$.

The apparatus 10 further includes a shunt FET 40 having a first shunt terminal T40A coupled to both the first end node 14 of the main transistor-based switch 12 and the first terminal T30A, a second shunt terminal T40B coupled to the NDC gate terminal T38G of the NDC FET 38, and a shunt gate terminal T40G coupled to the gate terminal G1 of the first main FET 30. In the exemplary embodiment of FIG. 1, the shunt FET 40 is a positive channel FET (PFET). The shunt FET 40 disables the ON-state linearization network 18 when the main transistor-based switch 12 is in the OFF-state.

The apparatus 10 also includes a coupling capacitor C1 that is coupled between the NDC gate terminal of the NDC FET 38 and the second terminal of the Nth main FET 32. In one embodiment, the coupling capacitor C1 is a metal-insulator-metal (MIM) capacitor, and in another embodiment the coupling capacitor C1 is a metal-oxide-metal (MOM) capacitor. At least one advantage of using either a MIM capacitor or a MOM capacitor for coupling capacitor C1 is that either of a MIM type capacitor or a MOM type capacitor can withstand relatively large voltage amplitudes of UL-CA signals that are applied across the first end node 14 and the second end node 16 of the main transistor-based switch 12.

Figure 2:
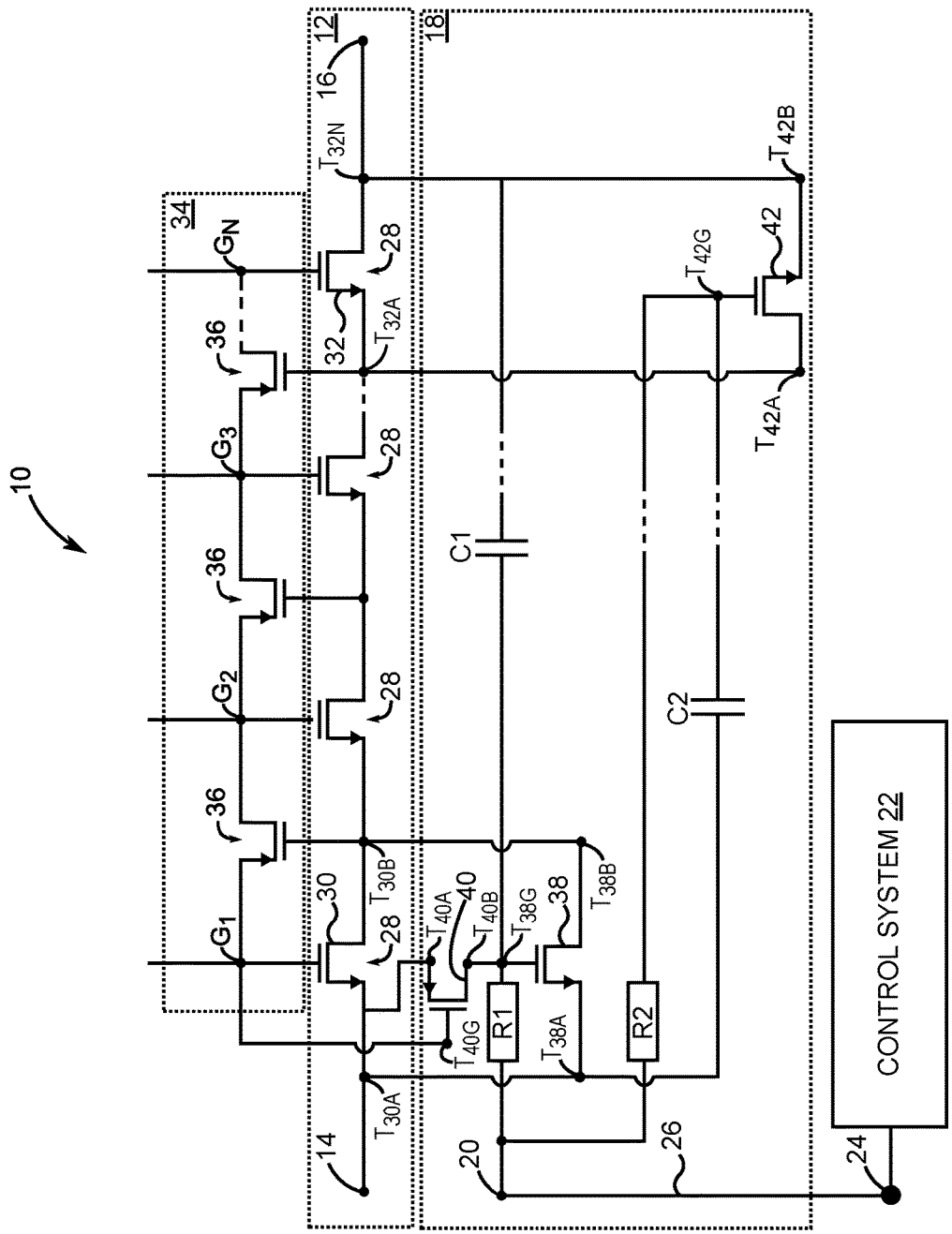
FIG. 2 is a schematic of a second exemplary embodiment of the apparatus that includes more than one non-linear distortion cancellation (NDC) FET.

FIG. 2 is a schematic of a second exemplary embodiment of the apparatus 10 that includes a second NDC FET 42. In this second exemplary embodiment, the second NDC FET 42 has a third NDC terminal $T_{42A}$ coupled to the first terminal $T_{32A}$ of the Nth main FET 32 and a fourth NDC terminal $T_{42B}$ coupled to the second terminal $T_{32N}$ of the Nth main FET 32, and a second NDC gate terminal $T_{42G}$ coupled to the control input 20. A second coupling capacitor C2 is communicatively coupled between the second NDC gate terminal $T_{42G}$ of the second NDC FET 42 and the first terminal $T_{30A}$ of the first main FET 30.

Figure 3:
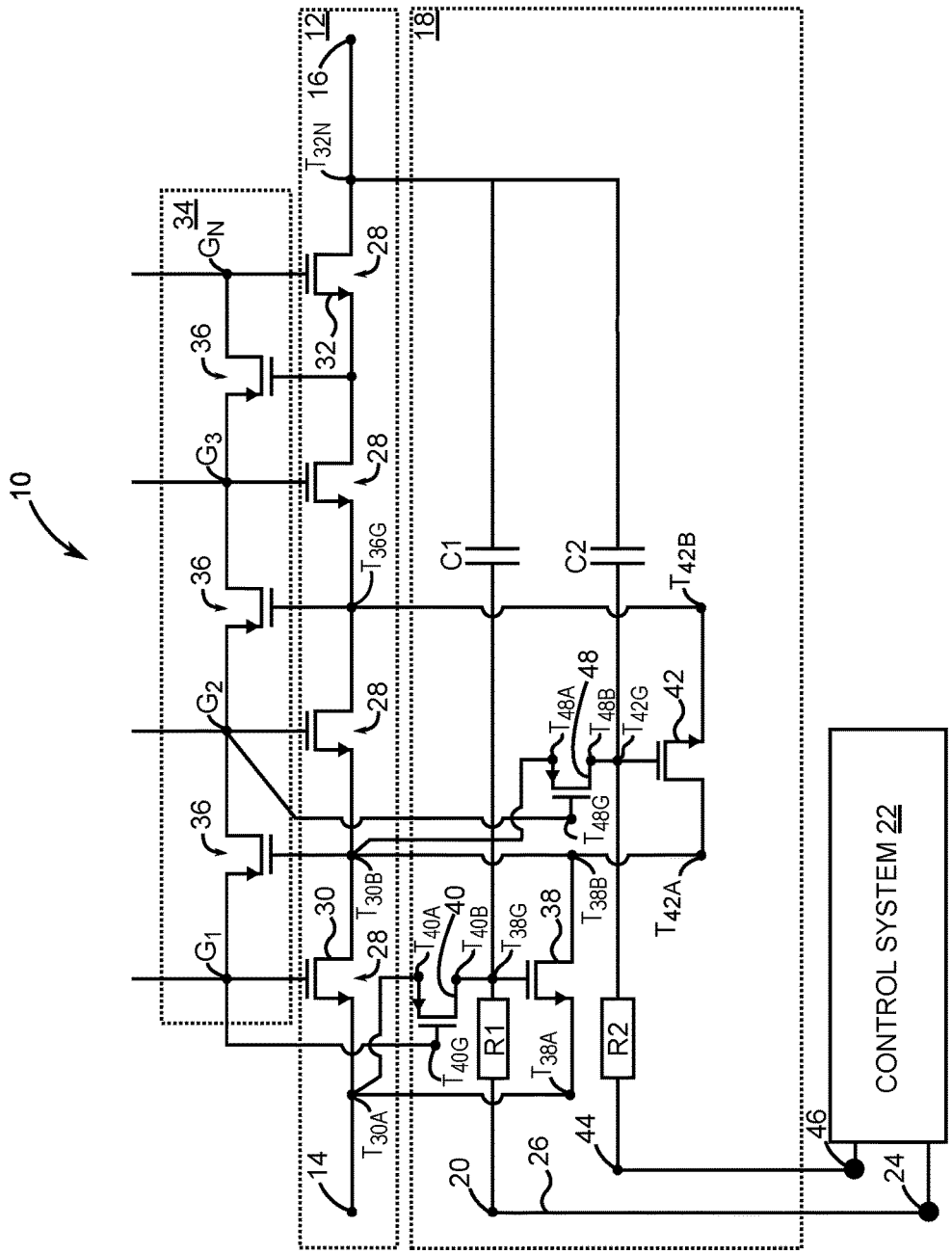
FIG. 3 is a schematic of a third exemplary embodiment of the apparatus that includes an additional NDC FET having a second NDC gate terminal coupled to a second control input.

FIG. 3 is a schematic of a third exemplary embodiment of the apparatus 10 that includes the second NDC FET 42 having the second NDC gate terminal $T_{42G}$ coupled to a second control input 44. In this case, the third NDC terminal $T_{42A}$ of the second NDC FET 42 is coupled to the second terminal $T_{30B}$ of the first FET and the fourth NDC terminal $T_{42B}$ of the second NDC FET 42 is coupled to the second terminal $T_{36G}$ of the second FET of the N number of main FETs 28.

Moreover, in this third exemplary embodiment, the control system 22 has a second control output 46 coupled to the second control input 44, wherein the control system 22 is further configured to provide a second control signal that turns on the second NDC FET 42 when the main transistor-based switch 12 is in an ON-state and turn off the second NDC FET 42 when the main transistor-based switch 12 is in the OFF-state. The second coupling capacitor C2 is coupled between the second NDC gate terminal $T_{42G}$ of the second NDC FET 42 and the second terminal of the Nth main FET 32. Apparatus 10 further includes a second shunt FET 48 having a third shunt terminal coupled to the second terminal $T_{30B}$ of the first main FET 30, a fourth shunt terminal $T_{48B}$ coupled to the NDC gate terminal $T_{42G}$ of the second NDC FET 42, and a second shunt gate $T_{48G}$ terminal coupled to the second gate terminal $G_2$ of the main switch 12.

Figure 4:
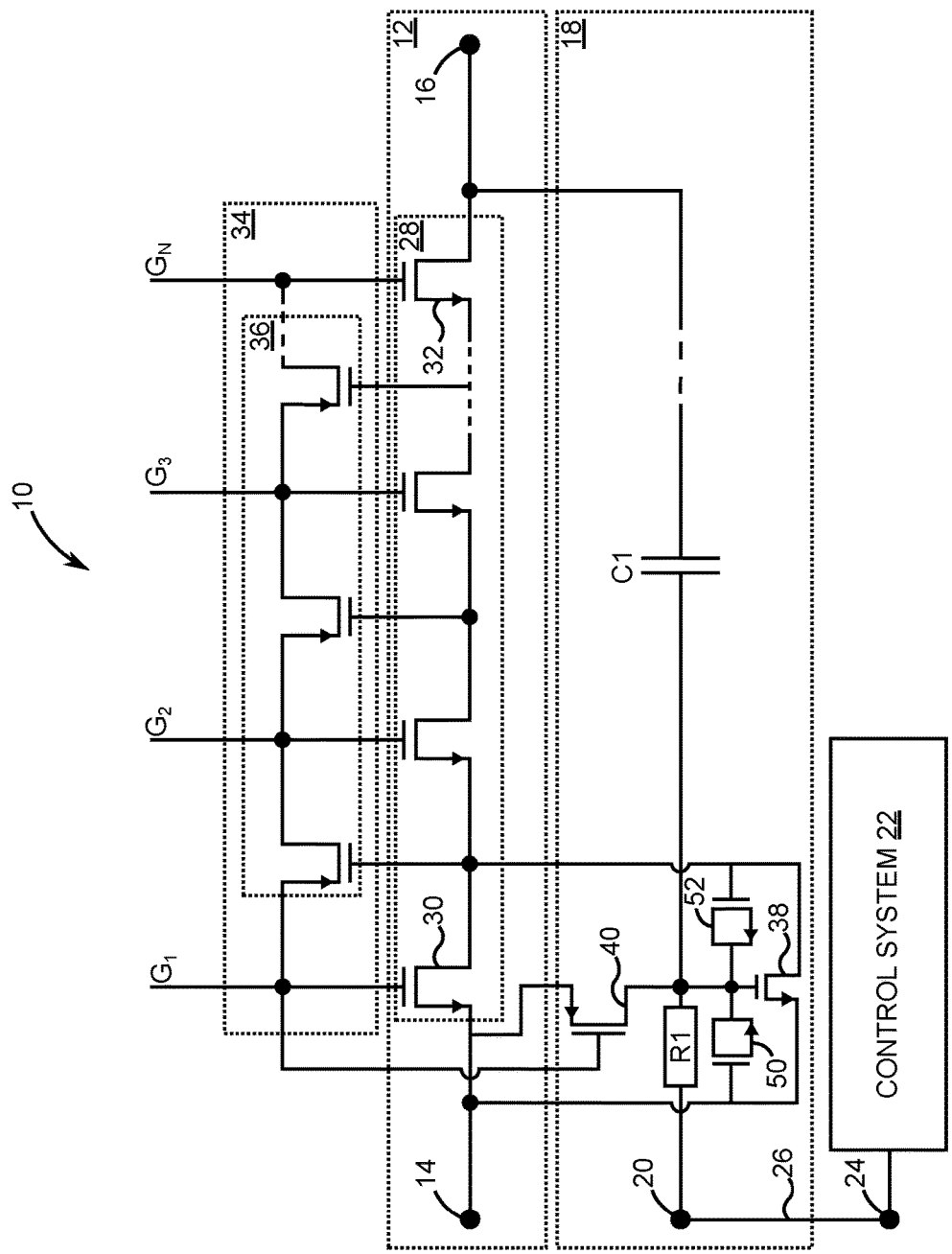
FIG. 4 depicts a fourth exemplary embodiment of the apparatus in which a first varactor configured FET and a second varactor configured FET are included to enhance bias sharing between the ON-state linearization network and the OFF-state linearization network.

FIG. 4 depicts a fourth exemplary embodiment of the apparatus 10 in which a first varactor configured FET 50 and a second varactor configured FET 52 are included to enhance bias sharing between the ON-state linearization network 18 and the OFF-state linearization network 34. In this fourth embodiment, the first varactor configured FET 50 having a first gate terminal $T_{50G}$ coupled to the first terminal $T_{30A}$ of the first main FET 30 and a first drain terminal $T_{50A}$ and a first source terminal $T_{50B}$ coupled together with the NDC gate terminal $T_{38G}$ of the NDC FET 38. The second varactor configured FET 52 having a second gate terminal $T_{52G}$ coupled to the second terminal $T_{30B}$ of the first main FET 30 and a second drain terminal $T_{52A}$ and a second source terminal $T_{52B}$ coupled together with the NDC gate terminal $T_{38G}$ of the NDC FET 38.

Figure 5:
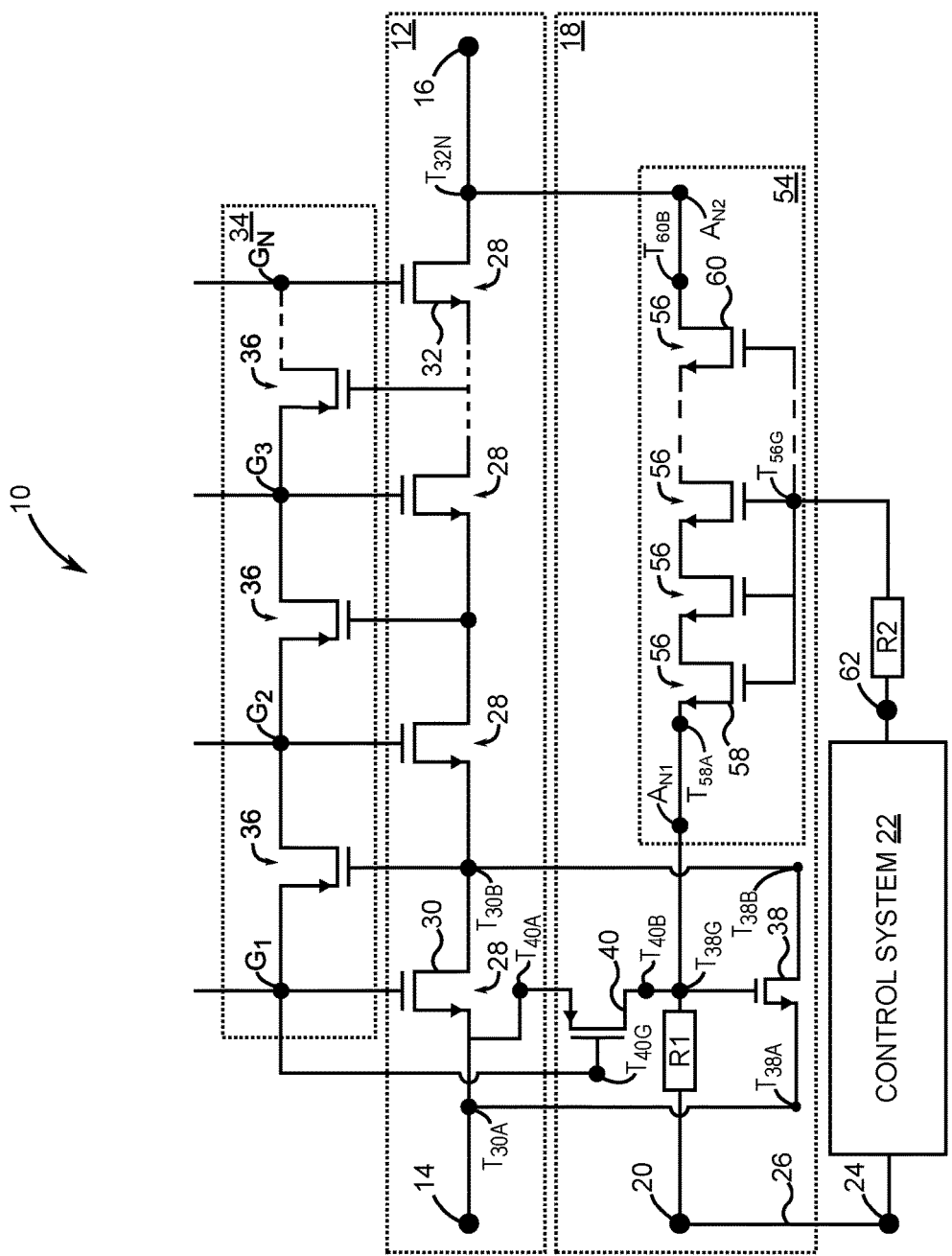
FIG. 5 depicts a fifth exemplary embodiment of the apparatus that further includes an auxiliary (AUX) transistor-based switch having a first AUX node coupled to the NDC gate terminal and a second AUX node coupled to a second terminal of an Nth main FET.

FIG. 5 depicts a fifth exemplary embodiment of the apparatus 10 that further includes an auxiliary (AUX) transistor-based switch 54 having a first AUX node $A_{N1}$ coupled to the NDC gate terminal $T_{38G}$ and a second AUX node $A_{N2}$ coupled to the second terminal $T_{32N}$ of the Nth main FET 32. In this particular embodiment, the AUX transistor-based switch 54 is made up of an M number of AUX FETs 56 that are stacked in series and such that a first AUX terminal $T_{58A}$ of a first AUX FET 58 of the M number of AUX FETs 56 is coupled to the first AUX node $A_{N1}$ and a second AUX terminal $T_{60B}$ of an Mth AUX FET 60 of the M number of AUX FETs 56 is coupled to the second AUX node $A_{N2}$, wherein M is a finite number greater than one. In this particular embodiment, the control system 22 is further configured to provide an AUX control signal to a common AUX gate terminal $T_{56G}$ that turns on the AUX transistor-based switch 54 when the main transistor-based switch 12 is in an ON-state and turn off the AUX transistor-based switch 54 when the main transistor-based switch 12 is in the OFF-state. In this particular embodiment, the AUX control signal is output through an AUX output terminal 62 that is coupled to the common AUX gate terminal $T_{56G}$ of the M number of AUX FETs 56 through a buffer resistor R2. Series resistances of the M number of AUX FETs 56 are not critical because they pass a much smaller current than the N number of main FETs 28. As a result, the physical size of each of the M number of AUX FETs 56 is relatively smaller than the physical size of each of the N number of main FETs 28. The relatively smaller physical size of each of the M number of AUX FETs 56 presents a relatively smaller total parasitic capacitance to the main transistor-based switch 12. A negligible impact of a Figure of Merit (FOM) of the main transistor-based switch 12 is a benefit realized by the relatively smaller total parasitic capacitance offered by the AUX transistor-based switch 54.

Figure 6:
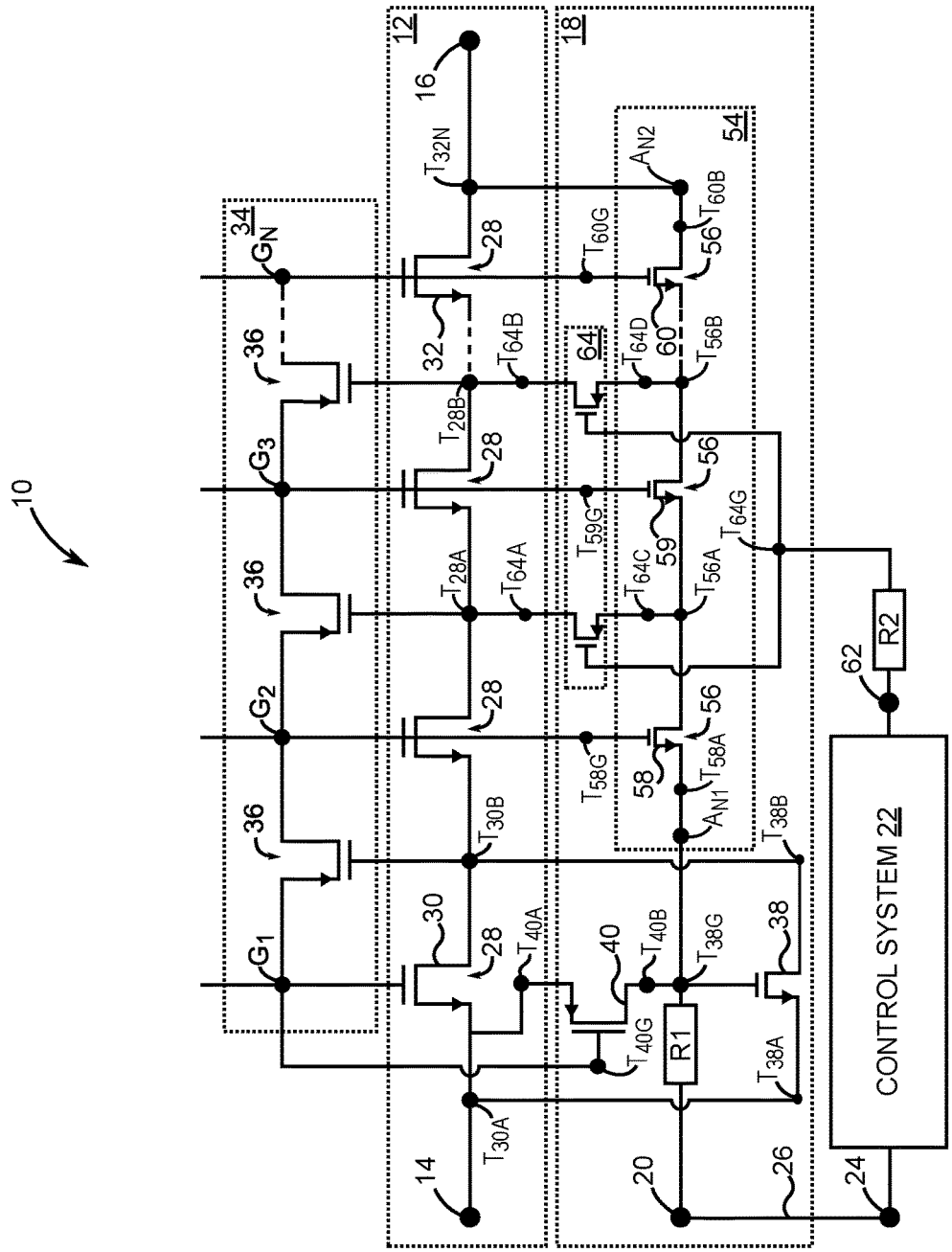
FIG. 6 depicts a sixth exemplary embodiment of the apparatus that further includes M−2 number of shorting FETs.

FIG. 6 depicts a sixth exemplary embodiment of the apparatus 10 that further includes M−2 number of shorting FETs 64. Each of the M−2 number of shorting FETs 64 has a first short terminal such as $T_{64A}$ and $T_{64B}$ coupled to the second terminal $T_{28A}$ and $T_{28B}$ of a corresponding preceding one of the N number of main FETs 28. Moreover, each of the M−2 number of shorting FETs 64 has a gate terminal $T_{64G}$ that is communicatively coupled to the output 62 of the control system 22 and a second short terminal such as T64C and T64D coupled to the second AUX terminal such as $T_{56A}$ and $T_{56B}$ of a corresponding preceding one of the M number of AUX FETs 56. Further still, in this sixth exemplary embodiment, the gate terminal $G_2$, $G_3$-$G_N$ of each of the N number of main FETs 28 except for the first gate terminal $G_1$ is coupled to AUX gate terminals such as $T_{58G}$, $T_{59G}$, and $T_{60G}$ of a corresponding one such as the first AUX FET 58, a second AUX FET 59, and the last AUX FET 60 of the M number of AUX FETs 56. In this particular embodiment, a shorting control signal is output through the AUX output terminal 62 that is coupled to shorting gate terminals of the M−2 number of shorting FETs 64 through the buffer resistor R2.

Figure 7:
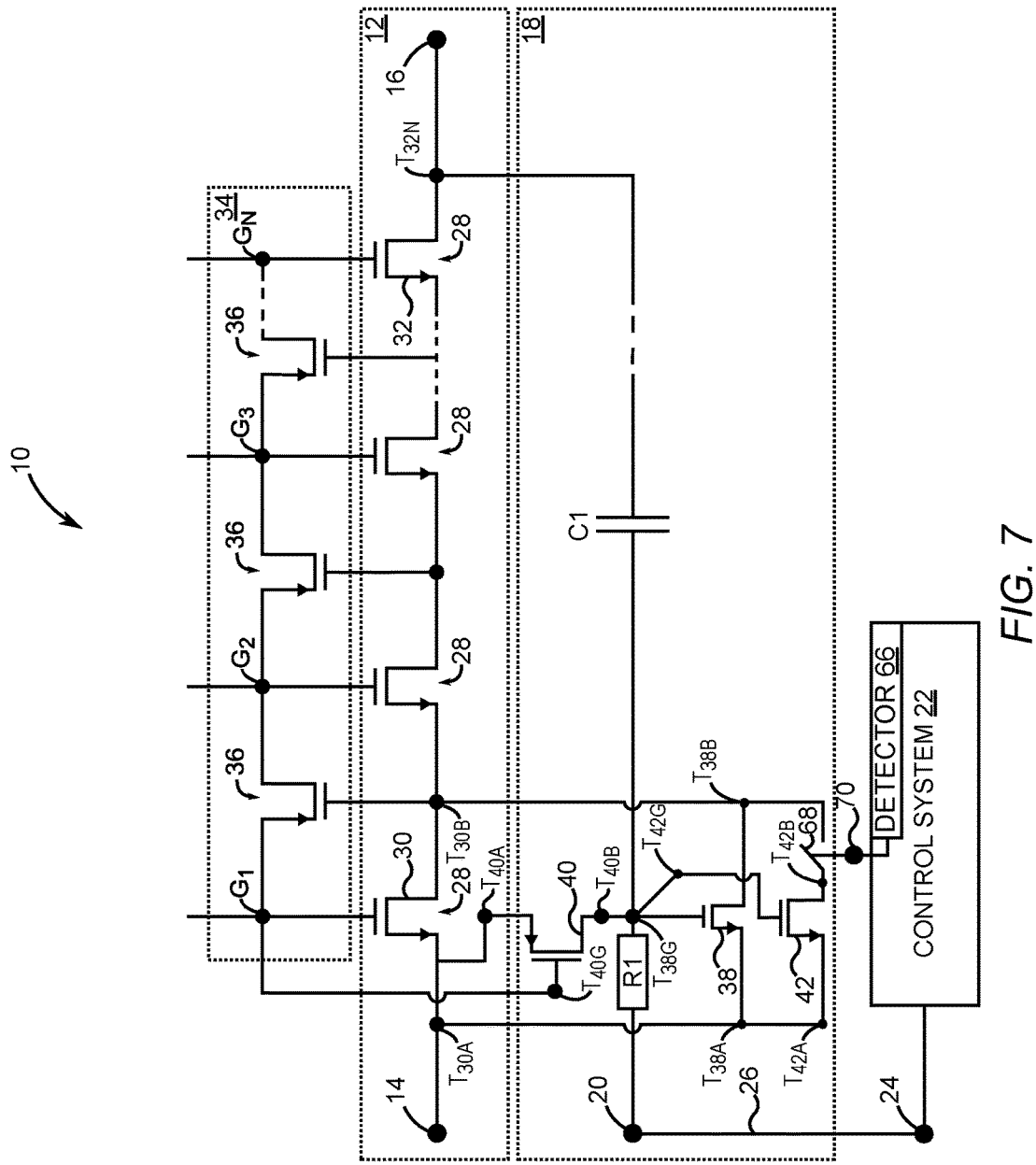
FIG. 7 depicts a seventh exemplary embodiment of the apparatus that further includes a detector that detects a predetermined condition such as a specified process corner or a specified temperature range.

FIG. 7 depicts a seventh exemplary embodiment of the apparatus 10 that further includes a detector 66 that detects a predetermined condition such as a specified process corner or a specified temperature range. For the purpose of this disclosure a process corner is defined as a design-of-experiments (DoE) technique that refers to a variation of fabrication parameters used in applying an integrated circuit design to a semiconductor wafer. The ON-state linearization network 18 in this seventh embodiment also includes at least the second NDC FET 42 that is selectably coupled in parallel with the NDC FET 38 in response to the detector detecting the predetermined condition. The second NDC gate terminal of the second NDC FET 42 is coupled to the control input 20, the third NDC terminal is coupled to the first NDC terminal, and a fourth NDC terminal is selectively coupled to the second NDC terminal by a detector controlled switch 68 that is selectively opened and closed by a detector signal output from a detector output 70. It is to be understood that the detector 66 and the control system 22 can be separate or integral with the control system 22 as shown in FIG. 7. Examples of the detector 66 fabricated separately from the control system 22 include realizations in both digital and/or analog circuitry. The detector 66 employs hysteresis to prevent undesirable toggling of the detector controlled switch 68 when a set point of the detector is near a range boundary of a temperature range or process corner.

In the exemplary embodiment of FIG. 7, ON-state distortion cancellation is enhanced by making the first NDC FET 38 and the second NDC FET 42 different sizes. The difference in sizes comes into use when the second NDC FET 42 is switched into or out of parallel with the first NDC FET 38 depending upon a predetermined process corner or temperature range being compensated for. If the predetermined process corner is known during manufacture of the apparatus 10, the closed or opened state of the detector controlled switch 68 can be made permanent by setting an associated fuse or non-volatile memory location.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
   a main transistor-based switch having a first end node and a second end node comprising an N number of main field effect transistors (FETs) each having a first terminal, a second terminal, and a gate terminal and stacked in series such that the first terminal of a first main FET of the N number of main FETs is coupled to the first end node and the second terminal of an Nth main FET of the N number of main FETs is coupled to the second end node, wherein N is a finite number greater than one;
   an ON-state linearization network that is coupled between the first end node and the second end node of the main transistor-based switch and configured to:
      receive a monitored signal that corresponds to a signal across the first end node and the second end node;
      cancel at least a portion of non-linear distortion generated by the main transistor-based switch when the main transistor-based switch is in an ON-state based on the monitored signal, wherein a control signal applied to a control input of the ON-state linearization network causes the ON-state linearization network to activate when the main transistor-based switch is in the ON-state and to deactivate the ON-state linearization network when the main transistor-based switch is an OFF-state; and
   a first non-linear distortion cancellation (NDC) FET having a first NDC terminal coupled to the first terminal of the first main FET and a second NDC terminal coupled to the second terminal of the first main FET, and an NDC gate terminal coupled to both the control input and the second terminal of the Nth main FET; and
   a control system having an output coupled to the control input and configured to provide the control signal.

2. The apparatus of claim 1 further including an OFF-state linearization network coupled between the gate terminal of the first main FET and the gate terminal of the Nth main FET.

3. The apparatus of claim 2 wherein the OFF-state linearization network comprises a K number of OFF-state noise cancelling (OSNC) FETs each having an input terminal, an output terminal, and a sense terminal, wherein individual ones of the K number of OSNC FETs have the input terminal coupled to the gate terminal of a nearest preceding one of the N number of main FETs, the output terminal coupled to the gate terminal of a nearest following one of the N number of main FETs and the sense terminal coupled to both the first terminal of the nearest following one of the N number of main FETs and the second terminal of the nearest preceding one of N number of main FETs.

4. The apparatus of claim 1 further including a resistor coupled between the control input and the NDC gate terminal of the first NDC FET.

5. The apparatus of claim 1 further including a shunt FET having a first shunt terminal coupled to the first end node of the main transistor-based switch, a second shunt terminal coupled to the NDC gate terminal of the first NDC FET, and a shunt gate terminal coupled to the gate terminal of the first main FET.

6. The apparatus of claim 5 further including a capacitor coupled between the NDC gate terminal of the first NDC FET and the second terminal of the Nth main FET.

7. The apparatus of claim 5 further including a second NDC FET having a third NDC terminal coupled to the first terminal of the Nth main FET and a fourth NDC terminal coupled to the second terminal of the Nth main FET, and a second NDC gate terminal coupled to the control input.

8. The apparatus of claim 7 further including a second capacitor coupled between the second NDC gate terminal of the first NDC FET and the first terminal of the first main FET of the N number of transistors.

9. The apparatus of claim 1 further including at least a second NDC FET having a third NDC terminal coupled to the second terminal of the first main FET and a fourth NDC terminal coupled to the second terminal of a second main FET of the N number of main FETs, and a second NDC gate terminal coupled to a second control input.

10. The apparatus of claim 9 including a second shunt FET having a third shunt terminal coupled to the second terminal of the first main FET, a fourth shunt terminal coupled to the second NDC gate terminal of the second NDC FET, and a second shunt gate terminal coupled to a gate terminal of a second FET of the N number of main FETs.

11. The apparatus of claim 10 wherein the control system has a second control output coupled to the second control input, wherein the control system is further configured to provide a second control signal that turns on the second NDC FET when the main transistor-based switch is in an ON-state and turns off the second NDC FET when the main transistor-based switch is in the OFF-state.

12. The apparatus of claim 10 further including a second capacitor coupled between the second NDC gate terminal of the second NDC FET and the second terminal of the Nth main FET.

13. The apparatus of claim 1 further including a first varactor configured FET having a first gate terminal coupled to the first terminal of the first main FET and a first drain terminal and a first source terminal coupled together with the NDC gate terminal.

14. The apparatus of claim 13 further including a second capacitor configured FET having a second gate terminal coupled to the second terminal of the first main FET and a second drain terminal and a second source terminal coupled together with the NDC gate terminal.

15. The apparatus of claim 1 further including an auxiliary (AUX) transistor-based switch having a first AUX node coupled to the NDC gate terminal and a second AUX node coupled to the second terminal of the Nth main FET.

16. The apparatus of claim 15 wherein the AUX transistor-based switch comprises an M number of AUX FETs each having a first AUX terminal, a second AUX terminal, and an AUX gate terminal and stacked in series and such that the first AUX terminal of a first FET of the M number of AUX FETs is coupled to the first AUX node and the second AUX terminal of an Mth one of the M number of AUX FETs is coupled to the second AUX node, wherein M is a finite number greater than one.

17. The apparatus of claim 16 wherein the control system is further configured to provide a control signal to each AUX gate terminal that turns on the AUX transistor-based switch when the main transistor-based switch is in an ON-state and turns off the AUX transistor-based switch when the main transistor-based switch is in the OFF-state.

18. The apparatus of claim 16 wherein the gate terminal of each of the N number of main FETs except for the first main FET is coupled to the AUX gate terminal of a corresponding one of the M number of AUX FETs.

19. The apparatus of claim 18 further including M−2 number of shorting FETs that each has a first short terminal coupled to both the second terminal of a corresponding preceding one of the N number of main FETs and the first terminal of a corresponding following one of the N number of main FETs.

20. The apparatus of claim 19 wherein each of the M−2 number of shorting FETs has a gate terminal coupled to the output of the control system and a second short terminal coupled to the second AUX terminal of a corresponding preceding one of the M number of AUX FETs and the first AUX terminal of a corresponding following one of the M number of AUX FETs.

21. The apparatus of claim 1 further including at least a second NDC FET having a second NDC gate terminal coupled to a second control input, a third NDC terminal coupled to the first NDC terminal, and a fourth NDC terminal.

22. The apparatus of claim 21 further including a detector that is configured to selectively couple the fourth NDC terminal to the second NDC terminal when the detector detects a predetermined condition.

23. The apparatus of claim 22 wherein the predetermined condition is a process corner.

24. The apparatus of claim 22 wherein the predetermined condition is a specified temperature range.

* * * * *